United States Patent
Phelan

[11] Patent Number: 6,166,991
[45] Date of Patent: Dec. 26, 2000

[54] CIRCUIT, ARCHITECTURE AND METHOD FOR REDUCING POWER CONSUMPTION IN A SYNCHRONOUS INTEGRATED CIRCUIT

[75] Inventor: Cathal Phelan, Mountain View, Calif.

[73] Assignee: Cypress Semiconductor Corp., San Jose, Calif.

[21] Appl. No.: 09/433,822

[22] Filed: Nov. 3, 1999

[51] Int. Cl.[7] ..................................... G11C 8/00
[52] U.S. Cl. ..................... 365/233; 365/189.05; 365/236
[58] Field of Search ............... 365/233, 230.08, 365/189.05, 236

[56] References Cited

U.S. PATENT DOCUMENTS

| | | | |
|---|---|---|---|
| 5,247,164 | 9/1993 | Takahashi | 235/492 |
| 5,247,655 | 9/1993 | Khan et al. | 395/550 |
| 5,254,888 | 10/1993 | Lee et al. | 307/480 |
| 5,337,285 | 8/1994 | Ware et al. | 365/227 |
| 5,430,393 | 7/1995 | Shankar et al. | 327/142 |
| 5,452,434 | 9/1995 | MacDonald | 395/550 |
| 5,563,839 | 10/1996 | Herdt et al. | 365/227 |
| 5,625,311 | 4/1997 | Nakatsu | 327/293 |
| 5,789,952 | 8/1998 | Yap et al. | 327/114 |
| 5,848,014 | 12/1998 | Yukshing | 365/227 |
| 6,088,290 | 7/2000 | Ohtake et al. | 365/233 |

Primary Examiner—Huan Hoang
Attorney, Agent, or Firm—Christopher P. Maiorana, P.C.; Robert M. Miller

[57] ABSTRACT

An apparatus comprising a first circuit and a second circuit. The first circuit may be configured to generate (i) an internal select signal and (ii) a control signal in response to one or more chip select signals. The second circuit may be configured to generate a sleep signal in response to (i) said control signal and (ii) a clock signal.

20 Claims, 2 Drawing Sheets

CIRCUIT, ARCHITECTURE AND METHOD FOR REDUCING POWER CONSUMPTION IN A SYNCHRONOUS INTEGRATED CIRCUIT

FIELD OF THE INVENTION

The present invention relates to synchronous integrated circuits generally and, more particularly, to a circuit, architecture and method for reducing power consumption in a synchronous integrated circuit.

BACKGROUND OF THE INVENTION

Present day electrical products often incorporate semiconductor devices. The use of semiconductor devices has enabled electrical products to accomplish tasks more quickly and efficiently than was previously possible. Improvements in the semiconductor devices have included reducing the amount of power consumed by the devices. One way that semiconductor devices can reduce power consumption is a "powered down" or "sleep" mode. In the sleep mode, input buffers and other current sinking elements are disabled. The electronic device enters the "powered down" or "sleep" mode after receiving a power reduction command signal.

An example of a conventional power reduction command signal is the Jedec-standard "ZZ" signal. A Jedec-standard package for semiconductor devices such as synchronous integrated circuits defines a "ZZ" input pin. The "ZZ" pin is configured to place the device in a "sleep" mode for reducing power consumption. A synchronous integrated circuit (e.g., an SRAM) is clocked with an externally applied clock signal. The "ZZ" sleep command signal can be activated asynchronously relative to the external clock.

According to conventional approaches, before activating the "ZZ" sleep mode, a synchronous integrated circuit is preferably first deselected by controlling chip enable input signals (e.g., CE and/or CEb). Therefore, to effectively use the reduced power "sleep" mode, (i) a relatively complex setup procedure must be followed, (ii) circuitry must be provided for generating the "ZZ" command signal, and a "ZZ" pin must be provided to receive the "ZZ" command signal.

SUMMARY OF THE INVENTION

The present invention concerns an apparatus comprising a first circuit and a second circuit. The first circuit may be configured to generate (i) one or more internal select signals and (ii) a control signal in response to one or more chip select signals. The second circuit may be configured to generate a sleep signal in response to (i) said control signal and (ii) a clock signal.

The objects, features, and advantages of the present invention include providing a circuit, architecture and method for reducing power consumption in a synchronous integrated circuit that may (i) be implemented without the need for a separate sleep pin (ii) eliminate the need for circuitry to generate a sleep signal, and/or (iii) automatically power down a chip that is deselected or unused after a predetermined length of time.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
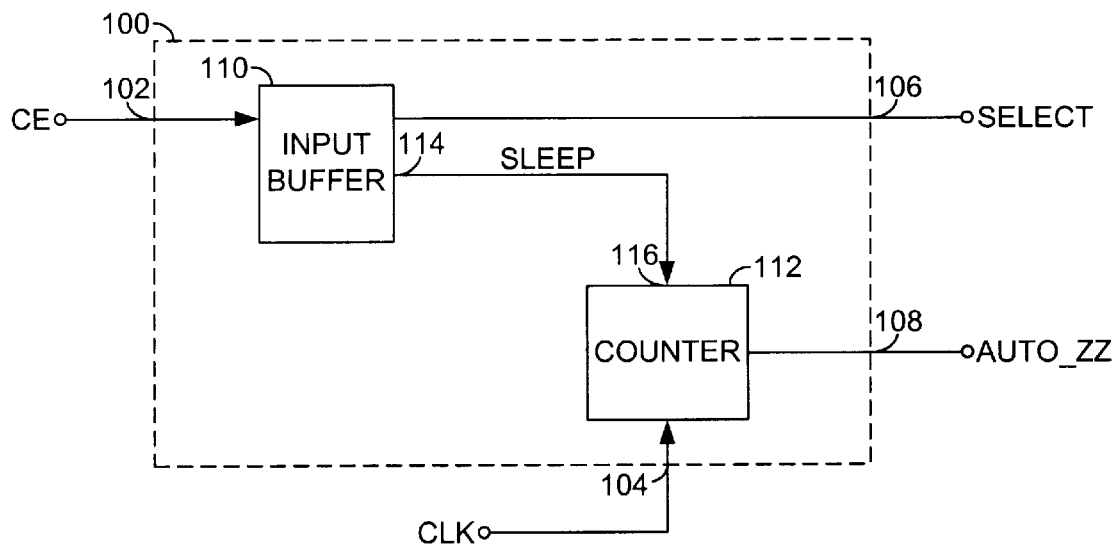
FIG. 1 is a block diagram illustrating a preferred embodiment of the present invention.

Referring to FIG. 1, a block diagram of a circuit 100 is shown in accordance with a preferred embodiment of the present invention. The circuit 100 may have an input 102, an input 104, an output 106, and an output 108. In one example, a chip enable signal (e.g., CE) may be presented to the input 102. However, one or more chip select signals may be presented accordingly to meet the design criteria of a particular application. The signal CE may be in an active state (e.g., chip enabled) or an inactive state (e.g., chip not enabled). A clock signal (e.g., CLK) may be presented to the input 104. The signal CLK may be an external or an internal clock signal.

The circuit 100 may be configured to generate an internal select signal (e.g., SELECT) at the output 106 in response to the signal CE. However, one or more internal select signals may be generated accordingly to meet the design criteria of a particular application. The circuit 100 may be configured to generate a sleep signal (e.g., AUTO_ZZ) at the output 108 in response to (i) the signal CE and (ii) the signal CLK. The signal AUTO_ZZ may have an active state (e.g., power consumption reduced) and an inactive state (e.g., full power operation). When the signal CE has been in the inactive state for a predetermined number of cycles of the signal CLK (e.g., N), the signal AUTO_ZZ will generally switch from the inactive state to the active state. When the signal CE enters the active state, the signal AUTO_ZZ will generally switch from the active state to the inactive state. The signal AUTO_ZZ may be used as a control signal. The signal AUTO_ZZ may be used, for example, to control the sleep control logic of a synchronous integrated circuit.

The circuit 100 generally comprises a circuit 110 and a circuit 112. The circuit 110 may be implemented, in one example, as an input buffer. The circuit 112 may be implemented, in one example, as a counter. The circuit 110 may be configured to generate (i) the signal SELECT and (ii) a control signal (e.g., SLEEP) at an output 114 in response to the signal CE.

The signal SLEEP may be presented to an input 116 of the circuit 112. The circuit 112 may be configured to generate the signal AUTO_ZZ in response to (i) the signal SLEEP and (ii) the signal CLK.

Figure 2:
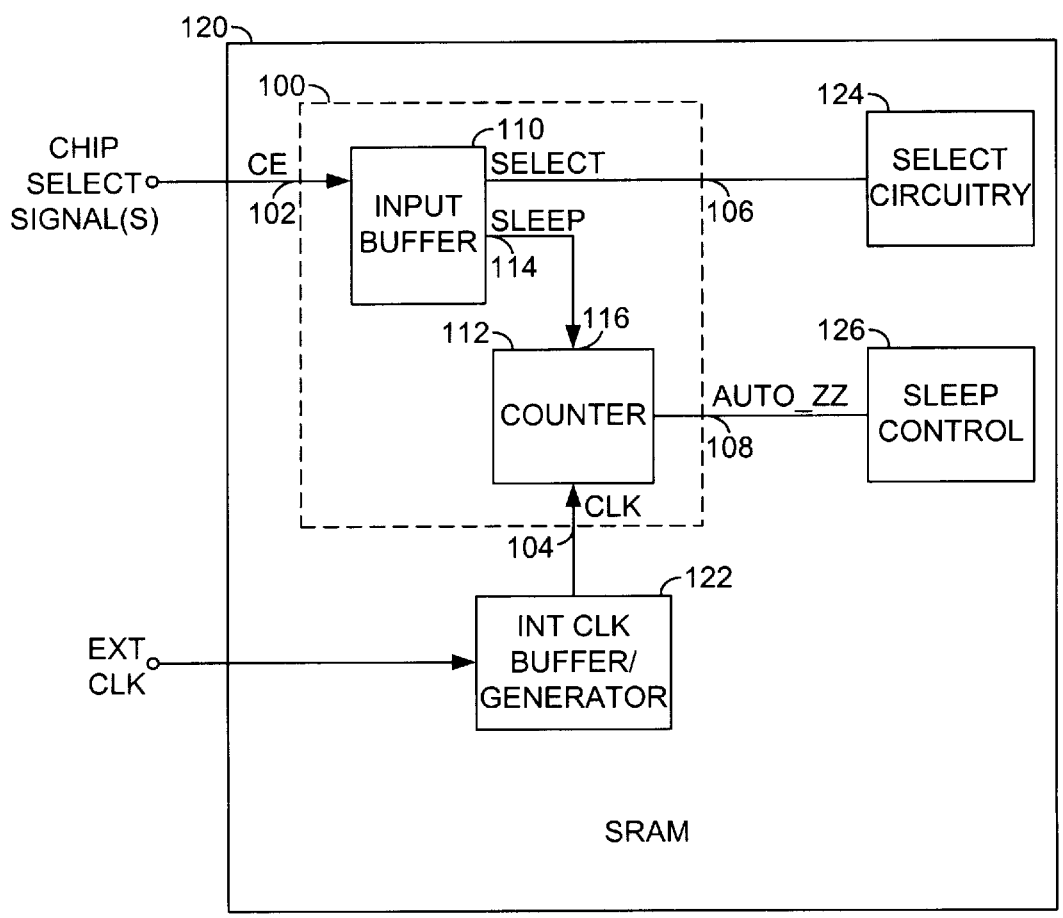
FIG. 2 is a block diagram illustrating the circuit of FIG. 1 implemented in a synchronous integrated circuit.

Referring to FIG. 2, the circuit 100 is shown implemented in the context of a synchronous integrated circuit 120. The synchronous integrated circuit 120 may be, in one example, an SRAM. However, the circuit 100 may be implemented as other types of synchronous circuits to meet the design criteria of a particular implementation. For example, the circuit 120 may be implemented as an application specific integrated circuit (ASIC). The signal CE may be provided by chip select signals of the synchronous integrated circuit 120. The signal CLK may be, in one example, provided by an internal clock buffer/generator 122. The signal SELECT may be presented to select circuitry 124 of the synchronous integrated circuit 120. The signal AUTO_ZZ may be presented to a sleep control 126 of the synchronous integrated circuit 120.

Figure 3:
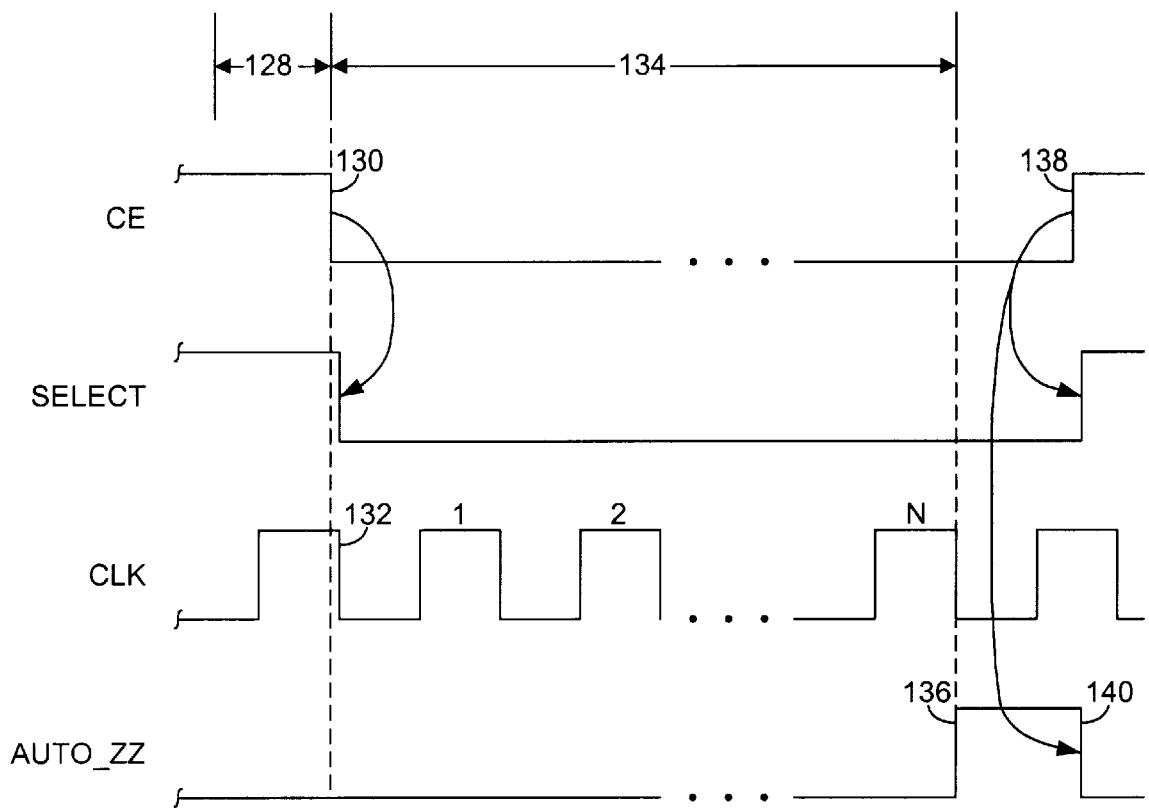
FIG. 3 is a timing diagram illustrating signals of the circuit of FIG. 1.

FIG. 3 is a timing diagram illustrating signals of the circuit 100. A portion 128 illustrates, in an example operation, that when the signal CE is active (e.g., a logic "1", or HIGH), the signal AUTO_ZZ will generally remain inactive (e.g., a logic "0", or LOW). When the signal CE becomes inactive (e.g., a logic "0", or LOW) at a transition 130, the circuit 112 generally counts pulses of the signal CLK beginning with the next edge (e.g., a transition 132). After the predetermined number of clock pulses N have been counted (e.g., a portion 134), the signal AUTO_ZZ generally becomes active (e.g., a logic "1", or HIGH) at a transition 136. When the signal CE becomes active (e.g., at a transition 138), the signal AUTO_ZZ becomes inactive (e.g., transition 140).

Figure 4:
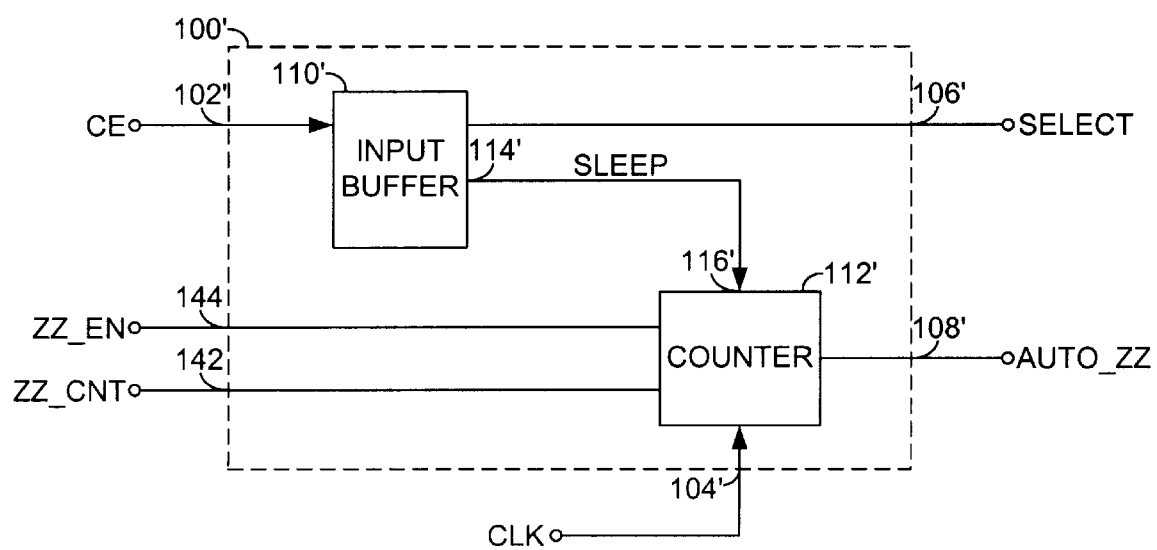
FIG. 4 is a block diagram illustrating an alternative embodiment.

Referring to FIG. 4, a block diagram of a circuit 100' is shown. The circuit 100' is generally implemented similarly to the circuit 100. The circuit 100' may have an input 142 and/or an input 144. The input 144 may be n-bits wide. A enable signal (e.g., ZZ_EN) may be presented to the input 142 of the circuit 100'. The signal ZZ_EN may be used to enable or disable generation of the signal AUTO_ZZ. The signal ZZ_EN may be presented, in one example, to the circuit 112'.

A control signal (e.g., ZZ_CNT) may be presented to the input 144 of the circuit 100'. The signal ZZ_CNT may be n-bits wide. The signal ZZ_CNT may be used to program the predetermined number of clock pulses N. The signal ZZ_CNT may be presented, in one example, to the circuit 112'.

While the invention has been particularly shown and described with reference to the preferred embodiments thereof, it will be understood by those skilled in the art that various changes in form and details may be made without departing from the spirit and scope of the invention. For example, the present invention may be implemented along with one or more portions of U.S. Pat. Nos. 5,935,255, 5,848,014 and 5,789,952, which are each hereby incorporated by reference in their entirety.

What is claimed is:

1. An apparatus comprising:
   a first circuit configured to generate (i) one or more internal select signals and (ii) a control signal in response to one or more chip select signals; and
   a second circuit configured to automatically generate a sleep signal in response to (i) said control signal and (ii) a clock signal.

2. The apparatus according to claim 1, wherein said one or more chip select signals comprise a chip enable signal.

3. The apparatus according to claim 1, wherein said one or more internal select signals correspond to said one or more chip select signals.

4. The apparatus according to claim 1, wherein said circuit is part of a synchronous integrated circuit.

5. The apparatus according to claim 1, wherein said first circuit is an input buffer.

6. The apparatus according to claim 5, wherein said second circuit is a counter.

7. The apparatus according to claim 4, wherein said synchronous integrated circuit is an SRAM.

8. The apparatus according to claim 4, wherein said synchronous integrated circuit is an application specific integrated circuit (ASIC).

9. The apparatus according to claim 1, wherein said clock signal is an external clock signal.

10. The apparatus according to claim 1, wherein said clock signal is an internal clock signal.

11. The apparatus according to claim 1, wherein said sleep signal is a Jedec-standard "ZZ" signal.

12. The apparatus according to claim 1, wherein said second circuit is enabled or disabled in response to an enable signal.

13. A circuit comprising:
    means for generating (i) a control signal and (ii) one or more internal select signals in response to one or more chip select signals; and
    means for generating a sleep signal in response to (i) said control signal and (ii) a clock signal.

14. A method for reducing power consumption in a synchronous integrated circuit comprising the steps of:
    (A) generating (i) a control signal and (ii) one or more internal select signals in response to one or more chip select signals; and
    (B) generating a sleep signal in response to (i) said control signal and (ii) a clock signal.

15. The method according to claim 14, wherein said synchronous integrated circuit is an SRAM.

16. The method according to claim 14, wherein said clock signal is an external clock signal.

17. The method according to claim 14, wherein said clock signal is an internal clock signal.

18. The method according to claim 14, wherein step B comprises the sub-steps of:
    (B-1) when said control signal is in a first state, counting a number of pulses of said clock signal;
    (B-2) when said number of pulses counted reaches a predetermined value, setting said sleep signal to a first state; and
    (B-3) when said control signal is in a second state, (i) resetting said number of pulses counted and/or (ii) setting said sleep signal to a second state.

19. The method according to claim 18, wherein said predetermined value is programmable.

20. The method according to claim 13, wherein said sleep signal is a Jedec-standard "ZZ" signal.

* * * * *